United States Patent [19]

Itou et al.

[11] Patent Number: 4,929,486
[45] Date of Patent: May 29, 1990

[54] COVER TAPE FOR SEALING CHIP-HOLDING PARTS OF CARRIER TAPE

[75] Inventors: Kazumi Itou; Kazuyoshi Ebe; Toshio Minagawa, all of Saitama, Japan

[73] Assignee: FSK Kabushiki Kaisha, Tokyo, Japan

[21] Appl. No.: 224,016

[22] Filed: Jul. 25, 1988

[30] Foreign Application Priority Data

Jul. 24, 1987 [JP] Japan .................................. 62-184985
Jul. 24, 1987 [JP] Japan .................................. 62-184986

[51] Int. Cl.$^5$ .............................................. C09J 7/02
[52] U.S. Cl. .................................... 428/77; 428/347; 428/352; 428/354
[58] Field of Search ................. 428/77, 347, 354, 906, 428/352

[56] References Cited

U.S. PATENT DOCUMENTS

| | | | |
|---|---|---|---|
| 2,307,406 | 1/1943 | Howard | 428/354 |
| 2,565,509 | 8/1951 | Marcin | 428/354 |
| 2,829,073 | 4/1958 | Williams | 428/906 |
| 3,608,711 | 9/1971 | Wiesler et al. | |
| 3,780,856 | 12/1973 | Braverman | |
| 4,211,329 | 7/1980 | Braverman | |

FOREIGN PATENT DOCUMENTS 0066339 12/1982 European Pat. Off. .
2439679 3/1975 Fed. Rep. of Germany ...... 428/354
2445273 7/1980 France .

Primary Examiner—Alexander S. Thomas
Attorney, Agent, or Firm—Wenderoth, Lind & Ponack

[57] ABSTRACT

A cover tape for sealing chips in chip-holding parts of a carrier tape having said parts provided discontinuously and longitudinally of said carrier tape, which cover tape comprises a base tape, an adhesive layer formed on one surface of said base tape and a non-adhesive coat formed on said adhesive layer along the longitudinal direction of said base tape so that said non-adhesive coat has a width broader than that of the chips and narrower than that of said adhesive layer. When the cover tape is used in combination with the carrier tape, the chip-holding parts are sealed by the cover tape having the non-adhesive coat and in consequence the chips held in the chip-holding parts do not come in contact with the adhesive layer although they might come in contact with the non-adhesive coat. Accordingly, the chips are not stained by the adhesive in the adhesive layer.

4 Claims, 2 Drawing Sheets

COVER TAPE FOR SEALING CHIP-HOLDING PARTS OF CARRIER TAPE

FIELD OF THE INVENTION

The present invention relates to a cover tape for sealing chips-holding parts of a carrier tape which is used for packaging chips, such as small electronic parts, arranged longitudinally of said carrier tape and in spaced apart relation, for the purpose of storage, transportation and automatic retrieval thereof. The invention also relates to a process for the preparation of such a cover tape.

BACKGROUND OF THE INVENTION

Recently, electronic parts such as resistances, condensers and integrated circuits have been miniaturized and used in the form of chips. To accomodate such a tendency, various devices for packaging such chips suitable for use in storage, transportation and automatic retrieval of the packaged chips have been proposed. Among others, devices based on a carrier tape appear to have the most promising prospects.

Such devices may be roughly classified into two types: (a) one using a carrier tape having apertures punched out, as disclosed in Japanese Utility Model Laid-open Publication No. 58-7,399, and (b) the other using an embossed carrier tape, as disclosed in Japanese Utility Model Laid-open Publication Nos. 62-65,959 and 61-202,362.

In the first type of device, use is made, as a carrier tape, of a relatively thick tape of paper having a row of apertures of a required dimension formed along the center line of the tape with a predetermined interval between successive apertures. Normally, another row of holes are provided along one of side edges of the carrier tape for the purpose of feeding the tape. A bottom tape is attached to one surface of the carrier tape so that each aperture forms a chip-holding space. After chips have been placed in respective chip-holding spaces, a cover tape is attached to the other surface of the carrier tape so as to seal the chips in position.

In the second type of device, as shown in FIG. 4, use is made, as a carrier tape, of an embossed plastic tape 3 having a row of depressed parts (chip-holding parts 1) of a required dimension formed along the center line of the tape with a predetermined interval between successive parts. Normally, another row of holes 2 are provided along one of side edges of the carrier tape for the purpose of feeding the tape. After chips 4 have been placed in respective chip-holding parts, a cover tape 5 is attached to the surface of the carrier tape so as to seal the chips 4 in position.

In both the types of devices, use is made of a cover tape 5, which normally comprises a base plastic tape 6 and a layer 7 of a heat sensitive adhesive formed on the base tape 6, which adhesive is inactive at ambient temperature and becomes active only when heated. Such a cover tape 5 is adhered to the carrier tape by application of heat and pressure particularly to those areas adjacent to the chip-holding parts 1.

The cover tape is required to firmly adhere to the carrier tape on the one hand. On the other hand, for retrieval of the stored chips, it is required that the cover tape can be peeled off from the carrier tape by a relatively weak force. Further, the chips must not be stained by the adhesive constituting the adhesive layer 7. In other words, the chips 4 should not come in contact with the adhesive layer 7 at least under conditions where the adhesive is active.

For these requirements, hot melt adhesives have heretofore been generally employed as the adhesive layer 7. However, problems have been associated with the hot melt adhesives in that the cover tape 5 must be adhered to the carrier tape 3 under heat in areas along both side edges having the cover tape 5 of a width of on the order of about one millimeter, frequently resulting in non-uniform adhesion. The step of adhesion under heat is also disadvantageous from the view point of the productive speed of the production line, and might invite undesirable heat deformation of the carrier tape 3. Further, in a case wherein the chips 4 are stored or transported at an elevated temperature, the hot melt adhesive is reactivated and might come in contact with the chips 4 to stain them.

OBJECT OF THE INVENTION

The invention is to solve the problems associated with the prior art and an object of the invention is to provide a cover tape which can be used in combination with a known carrier tape having chip-holding parts for sealing the chip-holding parts of the carrier tape and which does not stain the chips. Another object of the invention is to provide a process for the preparation of such a cover tape.

SUMMARY OF THE INVENTION

A cover tape according to the invention for sealing chips in chip-holding parts of a carrier tape having said parts provided intermittently and longitudinally of said carrier tape, comprises a base tape, an adhesive layer formed on one surface of said base tape and a non-adhesive coat pattern printed on said adhesive layer along the longitudinal direction of said base tape so that non-adhesive coat has a width broader than that of the chips and narrower than that of said adhesive layer.

A process for the preparation of a cover tape according to the invention for sealing chips in chip-holding parts of a carrier tape having said parts provided intermittently and longitudinally of said carrier tape, comprises the steps of forming an adhesive layer on one surface of a base tape, and pattern-printing a non-adhesive coat on said adhesive layer along the longitudinal direction of said base tape so that said non-adhesive coat has a width broader than that of the chips and narrower than that of said adhesive layer.

EFFECT OF THE INVENTION

According to the invention the chip-holding parts of the carrier tape are sealed by the cover tape having the non-adhesive coat so that the chips placed in the chip-holding parts of the carrier tape do not come in contact with the adhesive layer of the cover tape although they might come in contact with the non-adhesive coat of the cover tape, and in consequence the chips are not stained by the adhesive constituting the adhesive layer of the cover tape.

Further, those portions of the adhesive layer of the cover tape which are not occupied by the non-adhesive coat can uniformly and effectively adhere to those parts of the carrier tape other than the chip-holding parts to provide stable adhesion and peeling, and in consequence adhesion and peeling of the cover tape is easy and simple.

In cases wherein an antistatic agent is incorporated in the non-adhesive coat, the cover tape is prevented from being charged with static electricity, thereby effectively preventing damage of the chips by static charge and attraction of the chips to the cover tape upon peeling off of the cover tape which attraction might be a cause unintended removal of the chips.

Further, in cases wherein a pressure-sensitive adhesive which is sticky at ambient temperature is used to constitute the adhesive layer of the cover tape, adhesion of the cover tape to the carrier tape can be effected without using heat and pressure, ensuring not only easy processing but also uniform adhesion without a risk of heat deformation of the carrier tape.

DETAILED DESCRIPTION OF THE INVENTION

The invention will now be described in detail with reference to the attached drawings in which:

FIG. 1 (B) is a partly cross-sectional perspective view of a cover tape according to another embodiment of the invention;

Figure 1A:
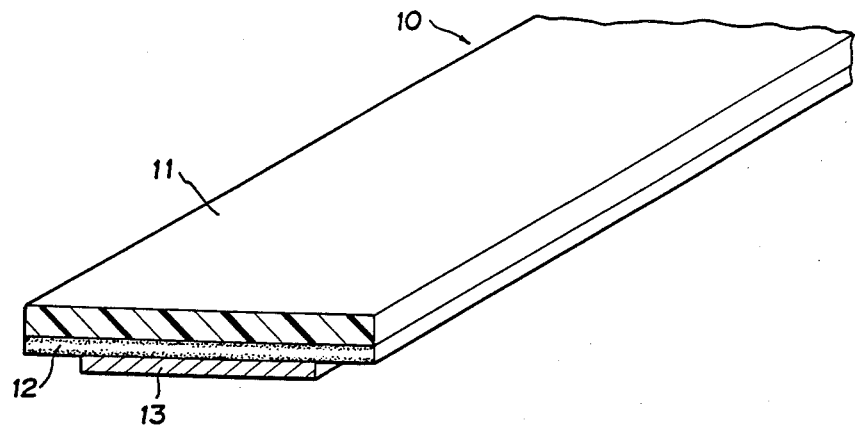
FIG. 1 (A) is a partly cross-sectional perspective view of a cover tape according to one embodiment of the invention.
Figure 1B:
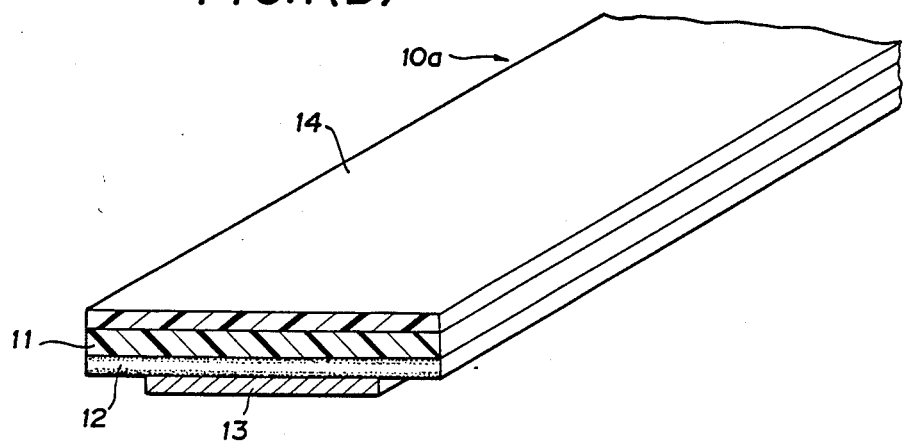

As shown in FIG. 1 (A), a cover tape 10 according to one embodiment of the invention comprises a transparent base tape 11, an adhesive layer 12, which is preferably sticky at ambient temperature, formed all over one of the surfaces of the base tape 11 and a non-adhesive coat 13 having a predetermined width formed on the adhesive layer 12.

Figure 2:
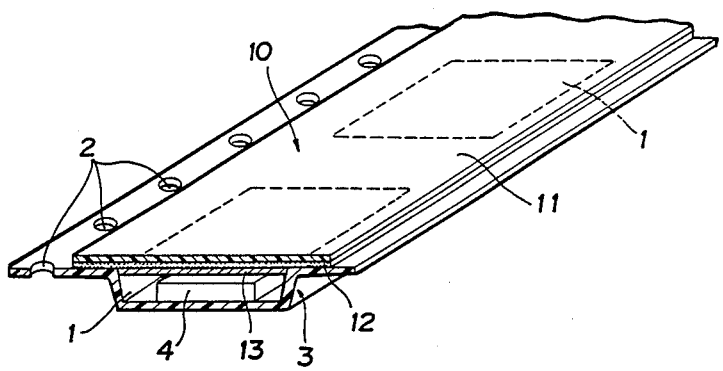
FIG. 2 is a partly cross-sectional perspective view of an assembly comprising an embossed carrier tape and a cover tape according to the invention.

The non-adhesive coat 13 extends along the longitudinal direction of the cover tape 10, and the width of the non-adhesive coat 13 is greater than that of chips 4 held in chips-holding parts 1 of a carrier tape 3 and less than that of the adhesive layer 12, as shown in FIG. 2. The width of the non-adhesive coat should preferably be the same as the width of the chips-holding parts 1 of the carrier tape 3, as shown in FIG. 2. By making it this width the chips 4 held in the parts 1 will be almost completely prevented from coming in contact with the adhesive layer 12 of the cover tape 10. For example, in a case wherein the carrier tape 3 has a width of 8 mm, the cover tape 10 has a width of 5.3 mm, and the chips have a width of not greater than 3 mm, the width of the non-adhesive coat may be on the order of 3.3 mm.

The cover tape 10 according to this embodiment can be prepared by forming an adhesive layer 12 on one surface of a base tape 11, and pattern-printing a non-adhesive coat 13 on said adhesive layer 12 so that the non-adhesive coat will extend continuously along the longitudinal direction and have a predetermined width.

Materials of the base tape 11 include polyethylene terephthalate (PET), polypropylene (PP), high density polyethylene, polystyrene, polyimide and polyvinyl chloride. Of these, PET is particularly preferred. The thickness of the base tape 11 is normally from 6 to 200 $\mu$m, and is preferably from 10 to 100 $\mu$m.

Preferred pressure-sensitive-adhesives which can be used to form the adhesive layer 12, are those which are sticky at ambient temperature, such as acrylic and methacrylic adhesives and rubber-based adhesives. Examples of (meth) acrylic adhesives include, for example, homopolymers and copolymers of (meth) acrylic acid esters such as ethyl, butyl, 2-ethylhexyl, glycidyl and 2-hydroxyethyl acrylates and methacrylates, and copolymers of at least one of such (meth) acrylates with at least one copolymerizable monomer such as vinyl acetate, acrylic acid, methacrylic acid, styrene and acrylonitrile. Examples of the rubber-based adhesives include, for example, natural rubbers (NR), polyisobutylene rubbers (IR), butadiene rubbers (BR), styrene-butadiene rubbers (SBR) and styrene-isoprene-styrene block copolymer (SIS), alone or in combination, as well as blends of at least one of such rubbers with at least one other of tackifiers such as rosin and terpene resins. The thickness of the adhesive layer 12 is normally from 5 to 100 $\mu$m, and is preferably from 10 to 50 $\mu$m.

The non-adhesive coat 13 is formed by pattern-printing with either oxidation curable inks based on linseed oil, tung oil, soybean oil and synthetic drying oils, or radiation-curable inks based on urethane acrylate, epoxy acrylate, polyester acrylate and polyethers. The ink used may be colored or may not be colored. Radiation-curable inks, in particular ultraviolet ray-curable inks, which are curable to a high crosslink density, are generally preferred. After a predetermined pattern of the coat 13 has been printed on the adhesive layer 12 with a radiation-curable ink, the printed pattern is subjected to irradiation, in particular ultraviolet ray-irradiation, to cure the ink, rendering the pattern-printed coat non-adhesive. The non-adhesive coat 13 so formed does not stain chips, even if it comes in contact with the chips. The thickness of the non-adhesive coat 13 is normally from 0.1 to 20 $\mu$m, and is preferably from 1 to 10 $\mu$m.

The ink, and in turn the non-adhesive coat 13 made therefrom, may contain an antistatic agent such as surfactants. When this is done, the non-adhesive coat 13 becomes antistatic, and thus it is possible to prevent damage of chips by static charge and static attraction of chips which might cause chips to adhere to the cover tape. Suitable antistatic agents which can be used herein include, for example, quaternary ammonium salts, aliphatic sulfonates, salts of higher alcohol sulfates, salts of higher alcohol phosphates, ethylene oxide adducts to higher alcohols and polyethylene glycol esters of fatty acids.

In cases wherein an antistatic agent is incorporated in the non-adhesive coat 13, the cover tape 10 is prevented from being charged with static electricity, thereby effectively preventing damage of the chips 4 by static charge and attraction of the chips 4 to the cover tape 10 upon peeling off of the cover tape, which attraction might be a cause of unintended removal of the chips 4.

Further, in cases wherein a pressure-sensitive adhesive which is sticky at ambient temperature is used to constitute the adhesive layer 12 of the cover tape 10, adhesion of the cover tape 10 to the carrier tape 3 can be effected without using heat and pressure, ensuring not only easy processing but also uniform adhesion without a risk of heat deformation of the carrier tape 3.

While the invention has been described with reference to FIG. 1 (A) and FIG. 2, it is not restricted thereto. Modifications within the scope of the appended claims will be apparent to a person skilled in the art.

Figure 3:
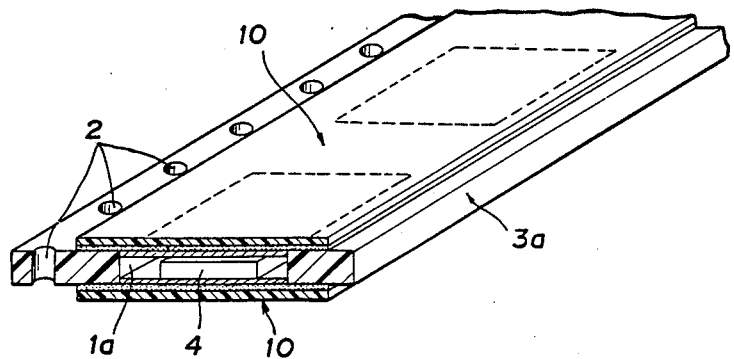
FIG. 3 is a partly cross-sectional perspective view of an assembly comprising a carrier tape having apertures and two cover tapes according to the invention.
Figure 4:
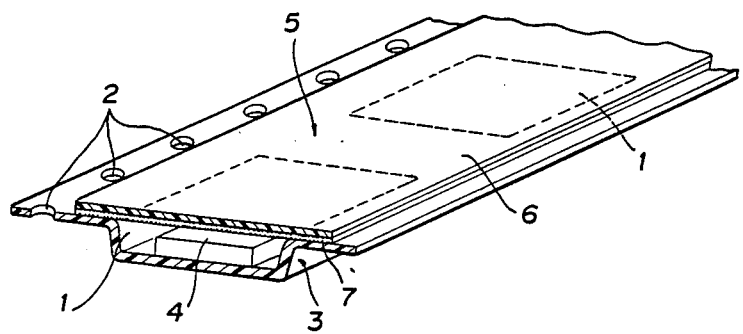
FIG. 4 is a partly cross-sectional perspective view of an assembly comprising an embossed carrier tape and a cover tape according to prior art.

For example, the carrier tape 10 according to the invention can be used in combination with an embossed carrier tape, as illustrated in FIG. 2. Likewise, as shown in FIG. 3, it can be used in combination with a carrier tape 3a having a row of apertures (chip-holding parts 1a) of a required dimension formed along the center line of the tape with a predetermined interval between successive apertures. In this case cover tapes 10 are adhered to both surfaces of the carrier tape 3a, respectively.

Further, as shown in FIG. 1 (B), a cover tape according to the invention may comprise a base tape 11, an adhesive layer 12 formed on one surface of said base tape 11, a non-adhesive coat 13 formed on said adhesive layer 12 along the longitudinal direction of said base tape so that said non-adhesive coat 13 has a width greater than that of the chips and less than that of said adhesive layer 12, and a layer of a releasing agent 14 formed on the opposite surface of said base tape 11. The cover tape 10a is stored in the form of a roll before use. In this state, the layer 14 advantageously provides the adhesive layer 12 of the rolled cover tape 10a with a releasing surface. Examples of the releasing agent which can be used to form the layer 14 include, for example, silicone, stearyl acrylate and stearyl maleate; and copolymers thereof with acrylic acid, methyl acrylate, acrylonitrole, maleic acid or styrene. Of these, copolymers of stearyl acrylate are particularly preferred.

Chips 4 that can be placed in the chip-holding parts 1, 1a of the carrier tape 3. 3a may be small mechanical parts and pharmaceutical tablets as well as small electronic parts.

While the invention has been described for the cases wherein the adhesive layer 12 is composed of a pressure-sensitive adhesive which is sticky at ambient temperature, the adhesive layer 12 may comprise a heat-sensitive adhesive. Examples of the heat-sensitive adhesive which can be used herein include, for example, ethylene-vinyl acetate rubber (EVA), styrene-butadiene rubber (SBR), ionomeric rubber, polybutadiene rubber (BR), styrene-isoprene-styrene block copolumer(SIS) and styrene-ethylene-butadiene-styrene block copolumer(SEBS).

While the invention will now be further described by the following examples, it is not restricted thereto.

EXAMPLE 1

One of the surfaces of a polypropylene film having a thickness of 40 μm was coated with a terpolymer of 2-ethylhexyl acrylate, vinyl acetate and acrylic acid to form a pressure-sensitive adhesive layer having a thickness of 20 μm. On the adhesive layer so formed a pattern of a predetermined width extending longitudinally of the tape was printed with a transparent, ultraviolet ray-curable, polyester acrylate-based ink. The printed coat was cured by ultraviolet ray irradiation. The cured coat had a thickness of about 6 μm.

The effect of the invention can be confirmed with the cover tape so prepared.

EXAMPLE 2

One of the surfaces of a polyethylene terephthalate film having a thickness of 25 μm was coated with a styrene-butadiene block copolymer to form a heat-sensitive adhesive layer having a thickness of 20 μm. On the adhesive layer so formed a pattern of a predetermined width extending longitudinally of the tape was printed with a transparent, ultraviolet ray-curable, epoxy acrylate-based ink. The printed coat was cured by ultraviolet ray irradiation. The cured coat had a thickness of about 6 μm.

The effect of the invention can be confirmed with the cover tape so prepared.

What is claimed is:

1. A cover tape for sealing chips in chip-holding parts of a carrier tape having said parts provided intermittently and longitudinally of said carrier tape, which cover tape comprises a base tape, an adhesive layer formed on only one surface of said base tape and a layer of non-adhesive radiation-cured or oxidation-cured ink pattern printed on said adhesive layer along the longitudinal direction of said base tape so that said non-adhesive layer has a width greater than that of the chips and less than that of said adhesive layer.

2. A cover tape as claimed in claim 1, further comprising a layer of releasing agent on the other surface of said base tape.

3. A cover tape for sealing chips in chip-holding parts of a carrier tape having said parts provided intermittently and longitudinally of said carrier tape, which cover tape comprises a base tape, an adhesive layer formed on only one surface of said base tape and a layer of non-adhesive antistatic agent containing printable material pattern printed on said adhesive layer along the longitudinal direction of said base tape so that said non-adhesive coat has a width greater than that of the chips and less than that of said adhesive layer.

4. A cover tape as claimed in claim 3, further comprising a layer of releasing agent on the other surface of said base tape.

* * * * *